(12) United States Patent
Takase et al.

(10) Patent No.: US 11,196,441 B2
(45) Date of Patent: Dec. 7, 2021

(54) SENSOR DEVICE INCLUDING A CAPACITIVE CHARGE OUTPUT DEVICE CONNECTED TO AN A/D CONVERTER

(71) Applicant: Murata Manufacturing Co., Ltd., Nagaokakyo (JP)

(72) Inventors: Yasuhide Takase, Nagaokakyo (JP); Yasuyuki Matsuya, Sagamihara (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 349 days.

(21) Appl. No.: 15/979,562

(22) Filed: May 15, 2018

(65) Prior Publication Data

US 2018/0262204 A1  Sep. 13, 2018

Related U.S. Application Data

(63) Continuation of application No. PCT/JP2016/082812, filed on Nov. 4, 2016.

(30) Foreign Application Priority Data

Nov. 20, 2015 (JP) .............................. JP2015-228203

(51) Int. Cl.
*H03M 3/00* (2006.01)
*H03M 1/20* (2006.01)
(Continued)

(52) U.S. Cl.
CPC ................ *H03M 3/32* (2013.01); *G01D 5/24* (2013.01); *H03M 1/208* (2013.01); *H03M 1/804* (2013.01); *H03M 3/422* (2013.01); *H03M 3/496* (2013.01)

(58) Field of Classification Search
CPC ........ H03M 3/32; H03M 1/208; H03M 1/804; H03M 3/422; H03M 3/496; G01D 5/24
(Continued)

(56) References Cited

U.S. PATENT DOCUMENTS 7,492,164 B2 * 2/2009 Hanhikorpi ............ G01D 5/243
                                                                      235/492
10,523,227 B2 * 12/2019 Takase .................. H03M 3/464
(Continued)

FOREIGN PATENT DOCUMENTS

| JP | 55-165027 A | 12/1980 |
| JP | 57-124933 A | 8/1982 |
| JP | 2003-318736 A | 11/2003 |

OTHER PUBLICATIONS

Official Communication issued in International Patent Application No. PCT/JP2016/082812, dated Jan. 24, 2017.

*Primary Examiner* — Jeff W Natalini
(74) *Attorney, Agent, or Firm* — Keating & Bennett, LLP (57) ABSTRACT

A sensor device includes an A/D converter including an adder that computes a difference between an analog input signal and a predicted value, the adder includes a capacitive adder defined by a series circuit including a capacitive charge output device and a capacitor. A capacitive component in the charge output device defines a portion of the capacitance of the capacitive adder. A digital prediction filter generates the predicted value based on an output from a quantizer. The capacitive adder computes the difference between the analog input signal from the charge output device and the predicted value. The quantizer quantizes and encodes the difference. The A/D converter performs a Δ modulation on the analog input signal which is converted into a digital signal.

16 Claims, 8 Drawing Sheets

(51) Int. Cl.
*H03M 1/80* (2006.01)
*G01D 5/24* (2006.01)

(58) Field of Classification Search
USPC .................................................. 324/658–690
See application file for complete search history.

(56) References Cited

U.S. PATENT DOCUMENTS

| | | | | |
|---|---|---|---|---|
| 10,581,453 | B1* | 3/2020 | Ganta | H03M 3/43 |
| 2008/0062022 | A1* | 3/2008 | Melanson | H03M 3/464 |
| | | | | 341/143 |
| 2008/0272946 | A1* | 11/2008 | Melanson | H03M 3/44 |
| | | | | 341/143 |
| 2009/0309616 | A1* | 12/2009 | Klinghult | G06F 3/0416 |
| | | | | 324/686 |
| 2010/0045308 | A1* | 2/2010 | Hall | G01N 27/226 |
| | | | | 324/658 |
| 2011/0200070 | A1* | 8/2011 | Makinwa | G06K 19/0723 |
| | | | | 374/170 |
| 2013/0024169 | A1* | 1/2013 | Veerasamy | B32B 17/10036 |
| | | | | 703/2 |
| 2013/0207674 | A1* | 8/2013 | Hahl | G01F 23/266 |
| | | | | 324/672 |
| 2014/0167995 | A1* | 6/2014 | Tiew | H03M 3/30 |
| | | | | 341/143 |
| 2014/0368222 | A1 | 12/2014 | Curtis | |
| 2019/0044527 | A1* | 2/2019 | Takase | H03M 3/436 |

\* cited by examiner

SENSOR DEVICE INCLUDING A CAPACITIVE CHARGE OUTPUT DEVICE CONNECTED TO AN A/D CONVERTER

CROSS REFERENCE TO RELATED APPLICATIONS

This application claims the benefit of priority to Japanese Patent Application No. 2015-228203 filed on Nov. 20, 2015 and is a Continuation Application of PCT Application No. PCT/JP2016/082812 filed on Nov. 4, 2016. The entire contents of each application are hereby incorporated herein by reference.

BACKGROUND OF THE INVENTION

1. Field of the Invention

The present invention relates to a sensor device including an A/D converter. The A/D converter includes an adder that computes the difference between an analog input signal and the predicted value that is output from a prediction filter, and a quantizer that quantizes the difference so that the analog input signal is converted into a digital signal.

2. Description of the Related Art

In the related art, for example, an oversampling A/D converter is disclosed as an A/D converter in Japanese Unexamined Patent Application Publication No. 2003-318736. The oversampling A/D converter is a hybrid modulator that includes both of a $\Delta$ modulator which performs a $\Delta$ (delta) modulation and $\Delta\Sigma$ modulator which performs a $\Delta\Sigma$ (delta-sigma) modulation. The oversampling A/D converter performs the $\Delta\Sigma$ modulation on the difference, which is produced through the $\Delta$ modulation, between an input signal and a predicted value.

Figure 1A:
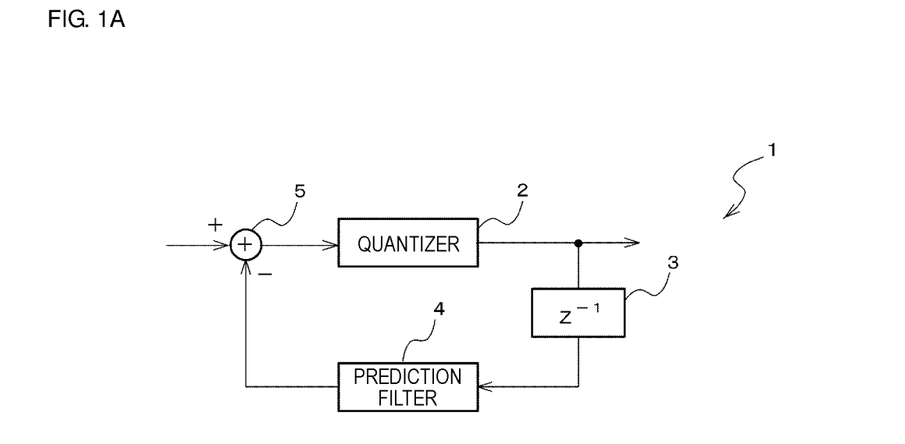
FIG. 1A is a block circuit diagram illustrating the configuration of a $\Delta$ modulator.
Figure 1B:
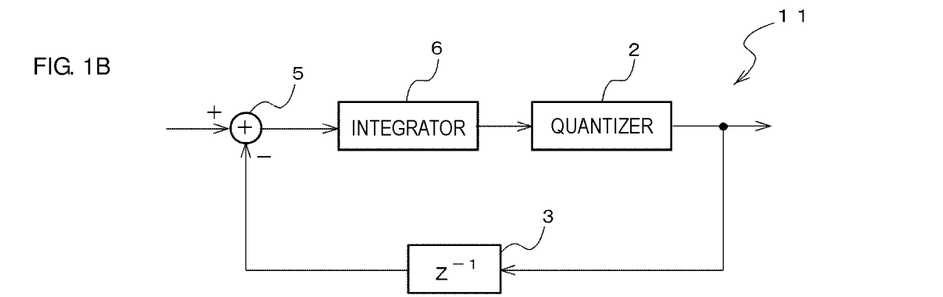
FIG. 1B is a block circuit diagram illustrating the configuration of a $\Delta\Sigma$ modulator.
Figure 1C:
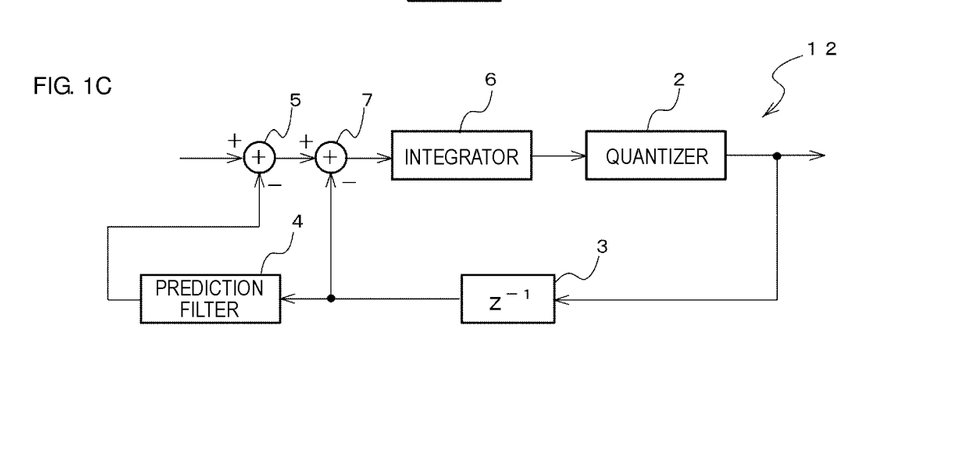
FIG. 1C is a block circuit diagram illustrating the configuration of a hybrid modulator using both of a $\Delta$ modulator and a $\Delta\Sigma$ modulator.

FIG. 1A illustrates the configuration of a $\Delta$ modulator 1. The output from a quantizer 2, which has been delayed by a delay device 3 by one sampling time, is integrated by a prediction filter 4, and the integrated output is output to an adder 5 as a predicted value. The adder 5 computes the difference between an input signal and the predicted value, and outputs the difference to the quantizer 2. The quantizer 2 encodes the input signal in accordance with a threshold every time a sampling clock is received. FIG. 1B illustrates the configuration of a $\Delta\Sigma$ modulator 11. The $\Delta\Sigma$ modulator 11 uses the adder 5 to compute the difference between a signal obtained by delaying the output of the quantizer 2 by one sampling time and an input signal. The difference is subjected to discrete-time integration by an integrator 6 so that noise shaping is performed. In the noise shaping, a quantization noise spectrum is increased in a high frequency domain. Then, the difference is quantized by the quantizer 2. FIG. 1C illustrates the configuration of a hybrid modulator 12. The hybrid modulator 12 uses the prediction filter 4 to integrate a signal obtained by the delay device 3 delaying the output of the quantizer 2. Thus, a predicted value is generated, and the adder 5 computes the difference between an input signal and the predicted value. The difference is subjected to the $\Delta\Sigma$ modulation described above. That is, an adder 7 computes the difference between the signal obtained by the delay device 3 delaying the output from the quantizer 2 and the output from the adder 5. The difference is subjected to noise shaping by the integrator 6, and is quantized by the quantizer 2.

The hybrid modulator 12 as described above has both of the advantages of the $\Delta$ modulator 1 and the advantages of the $\Delta\Sigma$ modulator 11. The hybrid modulator 12 widens the input voltage range through the $\Delta$ modulation, and moves quantization noise to a higher frequency domain through the $\Delta\Sigma$ modulation, so as to achieve a reduction in quantization noise in a needed signal band.

In a sensor device including the A/D converter of the related art, the input impedance of the adder 5 is to be sufficiently higher than the output impedance of an input signal source. Therefore, when a capacitive charge output device is used as an input signal source, since the charge output device itself has a high impedance, it is necessary to provide an impedance converter between the charge output device and the adder 5.

In addition, to detect the output of the capacitive charge output device, the integrator 6 needs an amplifier to replicate and add a charge. Actuation of this amplifier increases the power consumption of the A/D converter.

SUMMARY OF THE INVENTION

Preferred embodiments of the present invention provide sensor devices each including an A/D converter including an adder, a quantizer, and a digital prediction filter. The adder computes a difference between an analog input signal and a predicted value. The quantizer quantizes the difference which is output from the adder, and converts, for output, the analog input signal into a digital signal. The digital prediction filter generates the predicted value from the digital signal which is output from the quantizer, and outputs the predicted value to the adder. The adder includes a capacitive adder defined by a series circuit including a capacitive charge output device and a capacitor. A connecting point between the capacitive charge output device and the capacitor is connected to an input of the quantizer.

In this configuration, the digital prediction filter generates a predicted value from the output of the quantizer. The adder computes the difference between an analog input signal and the predicted value. The difference is quantized and encoded by the quantizer. Therefore, the analog input signal is subjected, in order to be converted into a digital signal, to a $\Delta$ modulation by the A/D converter including the adder, the quantizer, and the digital prediction filter. In the sensor device with this configuration, the adder which computes the difference between the analog input signal and the predicted value includes the capacitive adder defined by the series circuit of the capacitive charge output device, which is an input signal source, and the capacitor. The capacitive component included in the capacitive charge output device itself is used as a portion of the capacitance included in the capacitive adder. Therefore, the capacitive charge output device defines a portion of the adder which computes the difference between the analog input signal and the predicted value. The output itself of the capacitive charge output device is used without amplification, and the capacitive adder performs an addition operation. Therefore, it is not necessary to provide an impedance converting circuit which needs, in the related art, to be provided between an adder provided at the input of the A/D converter and a capacitive charge output device that has a high impedance and that is an input signal source. In addition, it is not necessary to provide an amplifier. Therefore, the sensor device including the A/D converter performing the $\Delta$ modulation is provided with low power consumption and a reduced size.

In a sensor device according to a preferred embodiment of the present invention, the capacitor includes a plurality of capacitors, and the plurality of capacitors are connected to each other in parallel. The digital prediction filter selects voltages applied to the plurality of capacitors, and uses the capacitor to perform D/A conversion on a voltage value applied to the connecting point, into an analog voltage value corresponding to the predicted value.

In this configuration, the predicted value that is output from the digital prediction filter is converted from a digital value into an analog voltage value such that, in accordance with the predicted value, the digital prediction filter selects the voltages applied to the capacitors included in the capacitive adder. Therefore, in the capacitive adder, the analog-signal voltage value that is output from the capacitive charge output device may be added to the predicted value that is output from the digital prediction filter.

In a sensor device according to a preferred embodiment of the present invention, the voltages applied to the plurality of capacitors are selected such that switching of switches connected to the plurality of capacitors is controlled. The controlling is performed by providing control signals to the switches. The control signals are signals in which a timing at which a voltage at the connecting point is decreased includes a delay from a timing at which the voltage at the connecting point is increased.

A parasitic diode may be attached to a connecting point between the capacitive charge output device and the capacitor. For example, a case in which the anode of the parasitic diode is connected to the ground and in which the cathode is connected to the connecting point will be described. In addition, assume that, during control of the switching of the switches, when a control signal is at the high level, the voltage at the connecting point increases, and that, when the control signal is at the low level, the voltage at the connecting point decreases. In this case, assume that switching of the switches connected to the capacitors is controlled such that the control signals in which the rising timing and the falling timing occur at the same time are provided to the switches. This causes a case in which, depending on the timings at which the control signals are generated, the falling timing of a control signal is earlier than the rising timing of another control signal, resulting in the occurrence of a negative glitch at the connecting point. When a negative glitch occurs, a forward direction voltage is applied to the parasitic diode, and the parasitic diode conducts. Thus, the charge accumulated in the capacitive adder is lost, and an error occurs in the addition operation performed by the capacitive adder. However, in this configuration, switching of the switches connected to the capacitors is controlled by providing, to the switches, the control signals in which a falling timing includes a delay from a rising timing. Therefore, the falling timing of a control signal occurs after the rising timing of another control signal. A glitch always occurs at the connecting point on the positive side, not on the negative side. Therefore, a forward direction voltage is not applied to the parasitic diode. The case in which the parasitic diode conducts and in which the charge accumulated in the capacitive adder is lost will not occur. As a result, no errors will occur in the addition operation performed by the capacitive adder.

In a sensor device according to a preferred embodiment of the present invention, the capacitive charge output device is connected to the connecting point through a resistor.

In this configuration, when a large amount of charge builds up unintentionally in the capacitive charge output device, the resistor prevents a large amount of current from flowing into the capacitive adder, thus enabling the capacitive adder to be protected.

In a sensor device according to a preferred embodiment of the present invention, the capacitive adder includes a loop filter, for example, a lag-lead filter, defined by a passive element.

In this configuration, the capacitive adder including the capacitive charge output device and the capacitor computes the difference between the analog input signal and the predicted value. The difference is integrated by the loop filter. The quantizer quantizes the integrated difference. Therefore, a hybrid modulation including both of a Δ modulation and a ΔΣ modulation is performed so as to achieve an improvement in the signal-to-quantization noise ratio (SQNR). The loop filter defined by passive elements is integrated into the capacitive adder. Therefore, it is not necessary to provide an amplifier which is necessary, in the related art, for the integrator to replicate the input signal. The sensor device including the A/D converter performing the hybrid modulation may be provided with low power consumption and a reduced size.

The lag-lead filter includes, for example, a first resistor, a second resistor, the capacitor, and a first series circuit of a third resistor and a capacitor. The first resistor is connected between the capacitive charge output device and the connecting point. The second resistor is connected between the connecting point and the capacitor. The capacitor is connected between the second resistor and the digital prediction filter. The first series circuit is connected between an input terminal of the quantizer and a reference voltage.

In addition, the lag-lead filter includes, for example, a resistor, the capacitor, and a first series circuit including a resistor and a capacitor. The resistor is connected between the connecting point and the quantizer. The capacitor is connected between the connecting point and the digital prediction filter. The first series circuit is connected between an input terminal of the quantizer and a reference voltage.

The resistor connected between the capacitive charge output device and the connecting point and the resistor connected between the connecting point and the capacitor in the former configuration of the lag-lead filter may be unified into a single resistor connected between the connecting point and the quantizer in the latter configuration of the lag-lead filter. Therefore, in the latter configuration of the lag-lead filter, the number of resistors is able to be reduced as compared to the former configuration, and the area in which components are mounted is able to be reduced.

In a sensor device according to a preferred embodiment of the present invention, the quantizer includes a comparator. The sensor device includes the first series circuit and a second series circuit including a resistor and a capacitor. The first series circuit is connected between a first input terminal of two input terminals of the comparator and the reference voltage. The second series circuit is connected between a second input terminal of the two input terminals and a reference voltage. The second series circuit has an impedance having the same or substantially the same amount as an impedance of the first series circuit.

According to this configuration, the series circuits, which have the same or substantially the same impedance, including a resistor and a capacitor are connected in a balanced manner between the respective two input terminals of the comparator included in the quantizer and the respective reference voltages. Therefore, when both of the two input terminals of the quantizer receive the same or substantially the same noise, the noise may be removed though a differential operation performed on the pair of input signals by the comparator included in the quantizer.

A sensor device according to a preferred embodiment of the present invention further includes switches that connect the two input terminals to the reference voltages.

In this configuration, for example, when a charge exceeding a range in which a circuit included in the A/D converter operates normally flows into the capacitive adder, the switches are conducted, and the pair of input terminals of the quantizer are connected to the respective reference voltages. Then, the charge accumulated in the capacitive adder is discharged through the switches, thus enabling the circuit to be reset.

A sensor device according to a preferred embodiment of the present invention further includes a switch that makes a short circuit between both terminals of the capacitive charge output device.

In this configuration, when a large amount of charge builds up in the capacitive charge output device, a short circuit between both the terminals of the capacitive charge output device is made by using the switch. Thus, the capacitive charge output device is able to be reset. Therefore, the stability of the output of the sensor device is improved.

Preferred embodiments of the present invention provide sensor devices each including an A/D converter which performs a $\Delta$ modulation or a hybrid modulation. The A/D converter which needs neither an impedance converting circuit nor an amplifier is reduced in size and has low power consumption.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings.

Figure 2:
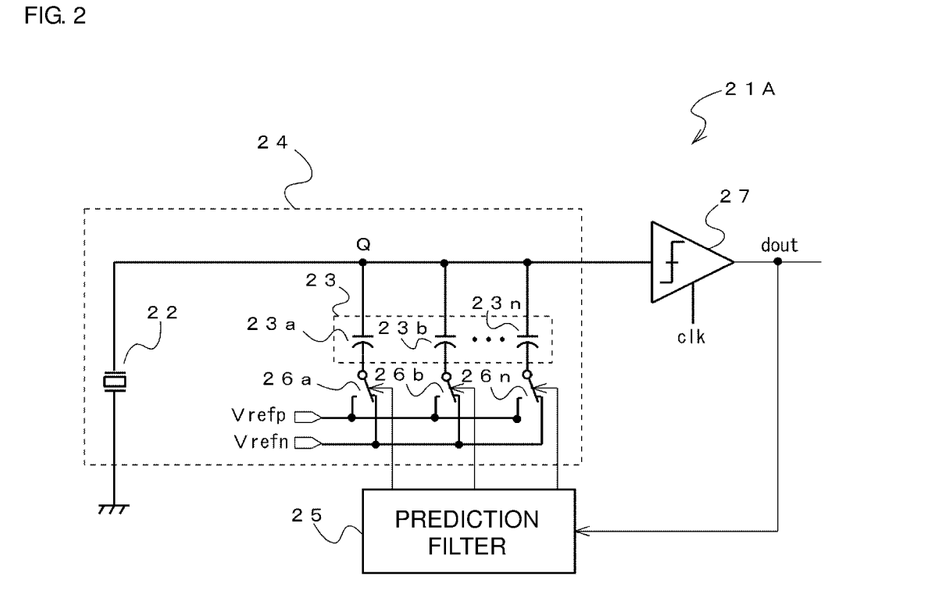
FIG. 2 is a circuit diagram illustrating a schematic configuration of a sensor device according to a first preferred embodiment of the present invention.

FIG. 2 is a circuit diagram illustrating a schematic configuration of a sensor device 21A according to a first preferred embodiment of the present invention.

The sensor device 21A includes a capacitive charge output device 22 defining a sensor, and converts, into the digital signal dout, an analog input signal resulting from a charge produced by the charge output device 22. Preferred examples of the capacitive charge output device 22 include a pyroelectric infrared sensor which produces a charge due to a pyroelectric effect caused by a change in the temperature of the device, and a piezoelectric-ceramics pressure/vibration/impact sensor which produces a charge proportional to a stress when the stress is applied to a piezoelectric device.

A series circuit including the charge output device 22 and a capacitor 23 defines a capacitive adder 24. A connecting point Q between the charge output device 22 and the capacitor 23 is connected to the input of a quantizer 27. The capacitor 23 includes a plurality of capacitors 23a, 23b, . . . , 23n which are connected in parallel. The capacitive adder 24 computes the difference between the analog input signal that is produced by the charge output device 22 and the predicted value that is output from a digital prediction filter 25. That is, in accordance with the charges accumulated in the capacitances of the charge output device 22 and the capacitor 23, the capacitive adder 24 adds the analog-input-signal voltage value, which is produced by the charge output device 22, to the analog voltage value according to the inverted predicted value which is output from the digital prediction filter 25. Thus, the capacitive adder 24 computes the difference between the analog input signal and the predicted value.

The analog voltage value according to the predicted value is obtained such that the digital prediction filter 25 selects voltages applied to the capacitors 23a, 23b, . . . , 23n and, by using the capacitor 23, the voltage value applied to the connecting point Q is D/A converted into an analog voltage value according to the digital predicted value. Switches 26a, 26b, . . . , 26n are provided between the capacitors 23a, 23b, . . . 23n, respectively, and the digital prediction filter 25.

By switching of the switches 26a, 26b, . . . , 26n, the Vrefp voltage or the Vrefn voltage is applied to the terminals of the capacitors 23a, 23b, . . . , 23n, respectively, that are opposite to the connecting-point-Q-side terminals. The Vrefp voltage is preferably set, for example, to about 1 [V], and the Vrefn voltage is preferably set, for example, to about 0 [V]. In addition, the capacitance values of the capacitors 23a, 23b, . . . , 23n are preferably set to about $2^0 \times C$ [F], about $2^1 \times C$ [F], about $2^2 \times C$ [F], . . . , about $2^n \times C$ [F], respectively. Therefore, the digital prediction filter 25 controls the switching states of the switches 26a, 26b, . . . , 26n in accordance with the digital predicted value computed by the digital prediction filter 25. Thus, the voltages applied to the capacitors 23a, 23b, . . . , 23n are selected so that the combined voltage value of the capacitors 23a, 23b, . . . , 23n is set to the analog voltage value according to the predicted value.

The quantizer 27 quantizes and encodes the difference that is output from the capacitive adder 24 every time a sampling clock clk is received, and coverts, for output, the analog input signal to the digital signal dout. The digital prediction filter 25 generates the digital predicted value from the digital signal dout that is output from the quantizer 27, and outputs the digital predicted value to the capacitive adder 24.

In the sensor device 21A according to the first preferred embodiment as described above, the digital prediction filter 25 generates the predicted value from the output from the quantizer 27, and the capacitive adder 24 computes the difference between the analog input signal produced from the charge output device 22 and the predicted value. The quantizer 27 quantizes and encodes the difference. Therefore, the analog input signal is subjected to a Δ modulation by an A/D converter including the capacitive adder 24, the quantizer 27, and the digital prediction filter 25, and is converted into the digital signal dout.

In the sensor device 21A according to the present preferred embodiment, the adder which computes the difference between the analog input signal and the predicted value includes the capacitive adder 24 including the series circuit of the capacitive charge output device 22, which is an input signal source, and the capacitor 23. The capacitive component included in the capacitive charge output device 22 itself is used as a portion of the capacitance included in the capacitive adder 24. Therefore, the capacitive charge output device 22 is provided as a portion of the adder which computes the difference between the analog input signal and the predicted value. The output from the capacitive charge output device 22 is used without amplification, and the capacitive adder 24 performs an addition operation. Therefore, it is not necessary to provide an impedance converting circuit which, in the related art, must be provided between the adder provided at the input of the A/D converter and the capacitive charge output device 22 which is an input signal source and which has a high impedance. In addition, it is not necessary to provide an amplifier. Therefore, the sensor device 21A including the A/D converter which performs the Δ modulation has low power consumption and a reduced size.

In the sensor device 21A according to the present preferred embodiment, the predicted value that is output from the digital prediction filter 25 is converted from a digital value to an analog voltage value by the digital prediction filter 25 selecting, in accordance with the predicted value, the voltages applied to the capacitors 23a, 23b, . . . , 23n, which are included in the capacitive adder 24. Therefore, the capacitive adder 24 may add the analog-signal voltage value, which is output from the capacitive charge output device 22, to the predicted value, which is output from the digital prediction filter 25.

Figure 3:
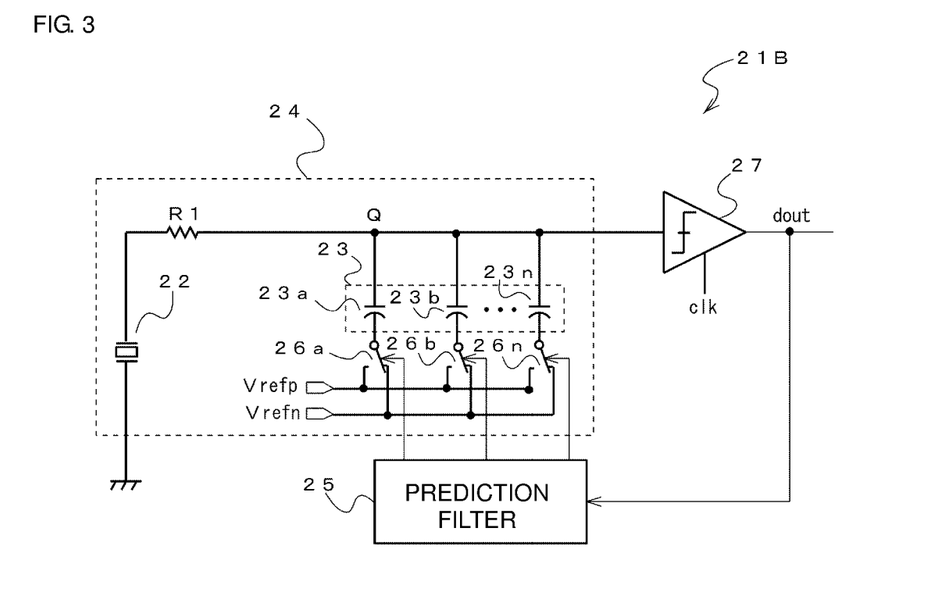
FIG. 3 is a circuit diagram illustrating a schematic configuration of a sensor device according to a second preferred embodiment of the present invention.

FIG. 3 is a circuit diagram illustrating a schematic configuration of a sensor device 21B according to a second preferred embodiment of the present invention. In FIG. 3, components identical to or corresponding to those in FIG. 2 are designated with the same reference characters, and will not be described.

The sensor device 21B according to the second preferred embodiment is different from the sensor device 21A according to the first preferred embodiment only in that the capacitive charge output device 22 is connected to the connecting point Q through a resistor R1.

In the sensor device 21B according to the second preferred embodiment, when the capacitive charge output device 22 unintentionally produces a large amount of charge, the resistor R1 prevents a large amount of current from flowing into the capacitive adder 24. Therefore, the capacitive adder 24 is protected.

Figure 4A:
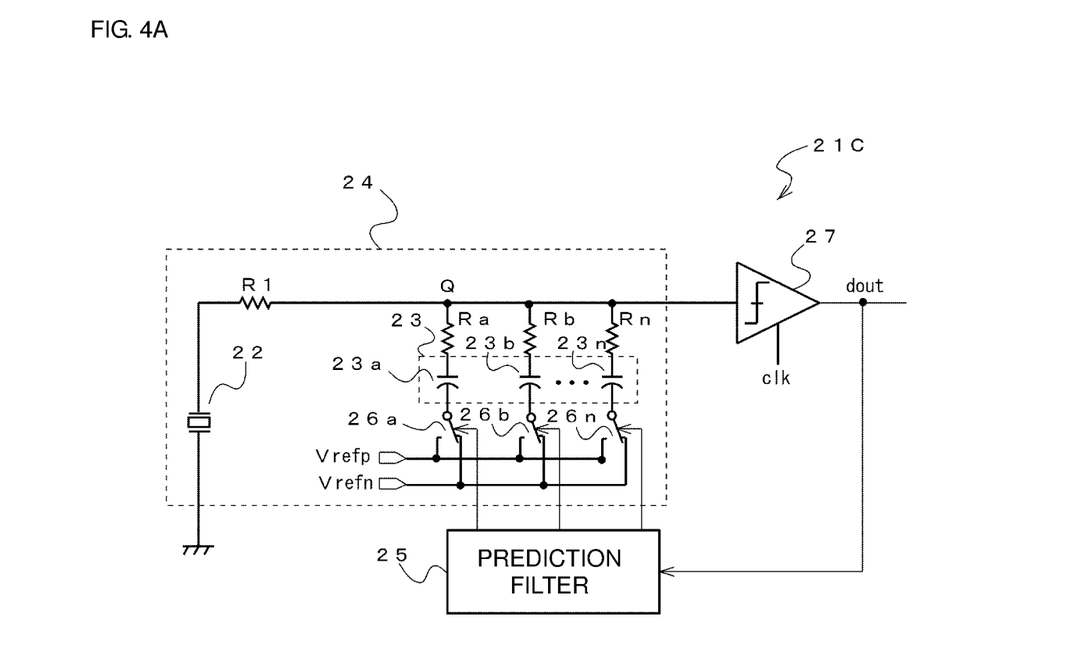
FIG. 4A is a circuit diagram illustrating a schematic configuration of a sensor device according to a third preferred embodiment of the present invention.

FIG. 4A is a circuit diagram illustrating a schematic configuration of a sensor device 21C according to a third preferred embodiment of the present invention. In FIG. 4A, components identical to or corresponding to those in FIG. 3 are designated with the same reference characters, and will not be described.

The sensor device 21C according to the third preferred embodiment is different from the sensor device 21B according to the second preferred embodiment only in that resistors Ra, Rb, . . . , Rn are connected in series to the capacitors 23a, 23b, . . . , 23n, respectively, and that the capacitive adder 24 includes a loop filter preferably defined by passive elements. The resistor R1, the capacitors 23a, 23b, . . . , 23n, and the resistors Ra, Rb, . . . , Rn define a portion of a lag-lead filter which functions as a loop filter. In addition, the resistor R1 defines a portion of a lag-lead filter, and, at the same time, prevents a large amount of current from flowing, similar to the sensor built-in A/D converter 21B according to the second preferred embodiment. Thus, the capacitive adder 24 is protected.

In the sensor device 21C according to the third preferred embodiment, the capacitive adder 24 including the capacitive charge output device 22 and the capacitor 23 computes the difference between the analog input signal and the predicted value. The difference is integrated by the loop filter, and, similar to a ΔΣ modulator, noise shaping is performed. The quantizer 27 quantizes the integrated difference. Therefore, a hybrid modulation using both of a Δ modulation and a ΔΣ modulation is performed, achieving an improvement in the signal-to-quantization noise ratio (SQNR). The loop filter is preferably defined by passive elements of resistance devices and capacitor devices. Further, the loop filter is integrated with the capacitive adder 24. Therefore, it is not necessary to provide an amplifier which is necessary, in the related art, for the integrator 6 to replicate an input signal (see FIGS. 1A to 1C). Thus, the sensor device 21C including the A/D converter performing a hybrid modulation has low power consumption and a reduced size.

Figure 4B:
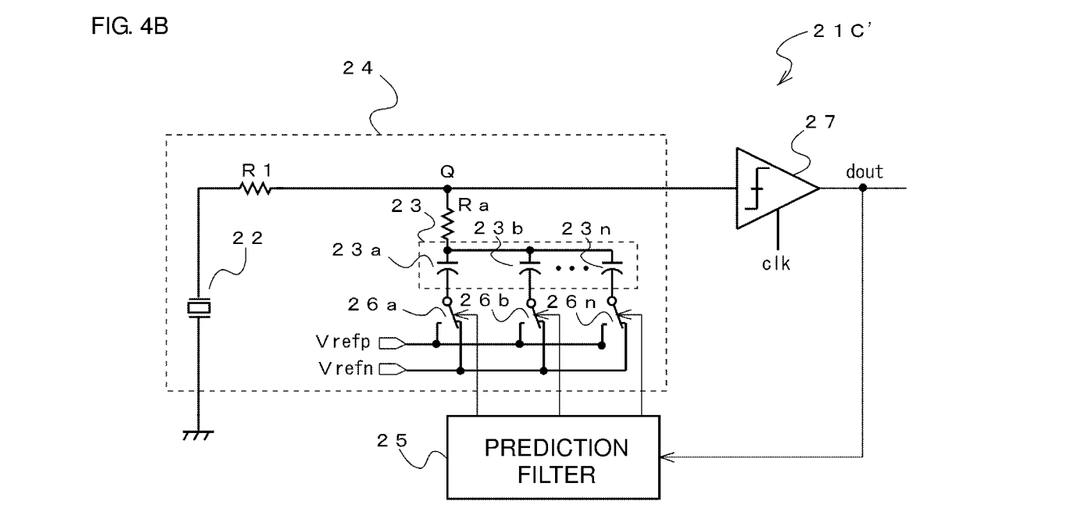
FIG. 4B is a circuit diagram illustrating a schematic configuration of a sensor device according to a modified example of the third preferred embodiment of the present invention.

FIG. 4B is a circuit diagram illustrating a schematic configuration of a sensor device 21C' according to a modified example of the third preferred embodiment. In FIG. 4B, components identical to or corresponding to those in FIG. 4A are designated with the same reference characters, and will not be described.

The sensor device 21C' according to the modified example of the third preferred embodiment is different from the sensor device 21C according to the third preferred embodiment only in that the capacitor 23 is connected to the resistor Ra in series. The resistor R1, the capacitors 23a, 23b, ..., 23n, and the resistor Ra define a portion of a lag-lead filter which functions as a loop filter.

Also in the sensor device 21C' according to the modified example of the third preferred embodiment, the capacitive adder 24 including the capacitive charge output device 22 and the capacitor 23 computes the difference between the analog input signal and the predicted value. The loop filter integrates the difference. Thus, a hybrid modulation using both of a Δ modulation and a ΔΣ modulation is performed. Accordingly, the sensor device 21C' provides a similar operational effect to the sensor device 21C according to the third preferred embodiment.

Figure 5A:
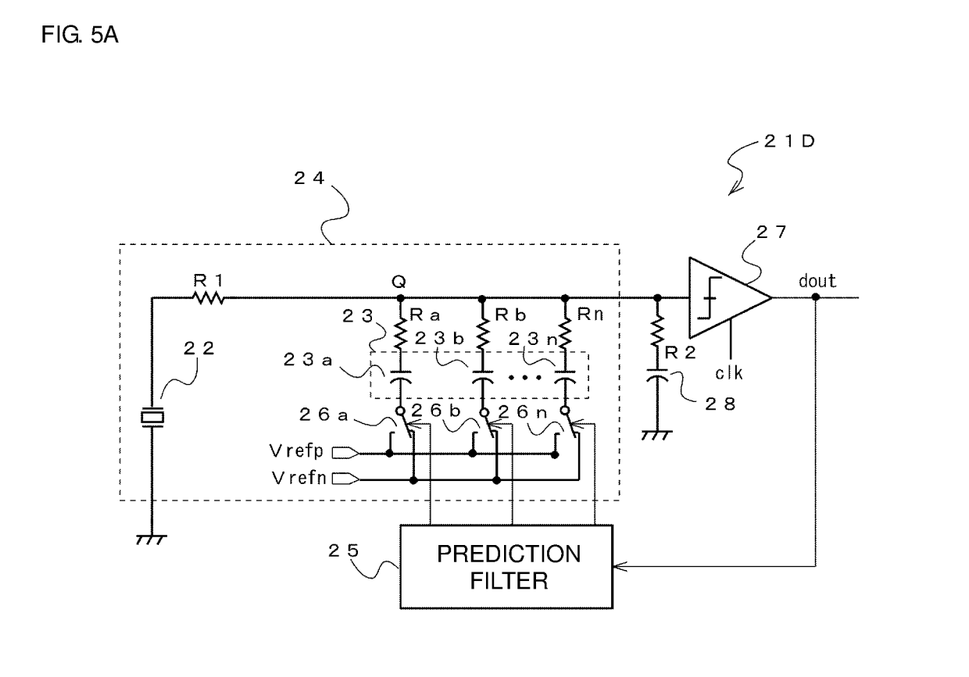
FIG. 5A is a circuit diagram illustrating a schematic configuration of a sensor device according to a fourth preferred embodiment of the present invention.

FIG. 5A is a circuit diagram illustrating a schematic configuration of a sensor device 21D according to a fourth preferred embodiment of the present invention. In FIG. 5A, components identical to or corresponding to those in FIG. 4A are designated with the same reference characters, and will not be described.

The sensor device 21D according to the fourth preferred embodiment is different from the sensor device 21C according to the third preferred embodiment only in that a series circuit including a resistor R2 and a capacitor 28 is connected to the connecting point Q, and that the series circuit is grounded. The resistor R1, the capacitors 23a, 23b, ..., 23n, the resistors Ra, Rb, ..., Rn, and the resistor R2 and the capacitor 28 included in the above-described series circuit define a lag-lead filter.

In the sensor device 21D according to the fourth preferred embodiment, the lag-lead filter defines and functions as a loop filter. Therefore, the sensor device 21D according to the fourth preferred embodiment is also able to perform a hybrid modulation and improve the signal-to-quantization noise ratio.

Figure 5B:
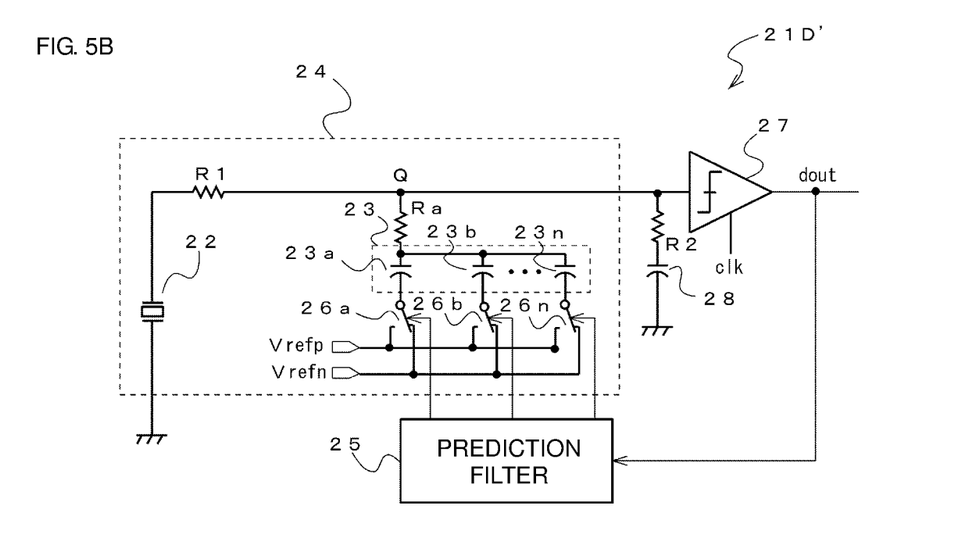
FIG. 5B is a circuit diagram illustrating a schematic configuration of a sensor device according to a first modified example of the fourth preferred embodiment of the present invention.

FIG. 5B is a circuit diagram illustrating a schematic configuration of a sensor device 21D' according to a modified example of the fourth preferred embodiment. In FIG. 5B, components identical to or corresponding to those in FIG. 5A are designated with the same reference characters, and will not be described.

The sensor device 21D' according to the modified example of the fourth preferred embodiment is different from the sensor device 21D according to the fourth preferred embodiment only in that the resistor Ra is connected to the capacitor 23 in series. The resistor R1, the capacitor 23, the resistor Ra, and the series circuit of the resistor R2 and the capacitor 28 define a lag-lead filter.

Also in the sensor device 21D' according to the modified example of the fourth preferred embodiment, the lag-lead filter defines and functions as a loop filter. Thus, the sensor device 21D' according to the modified example provides a similar operational effect to the sensor device 21D according to the fourth preferred embodiment.

Figure 6:
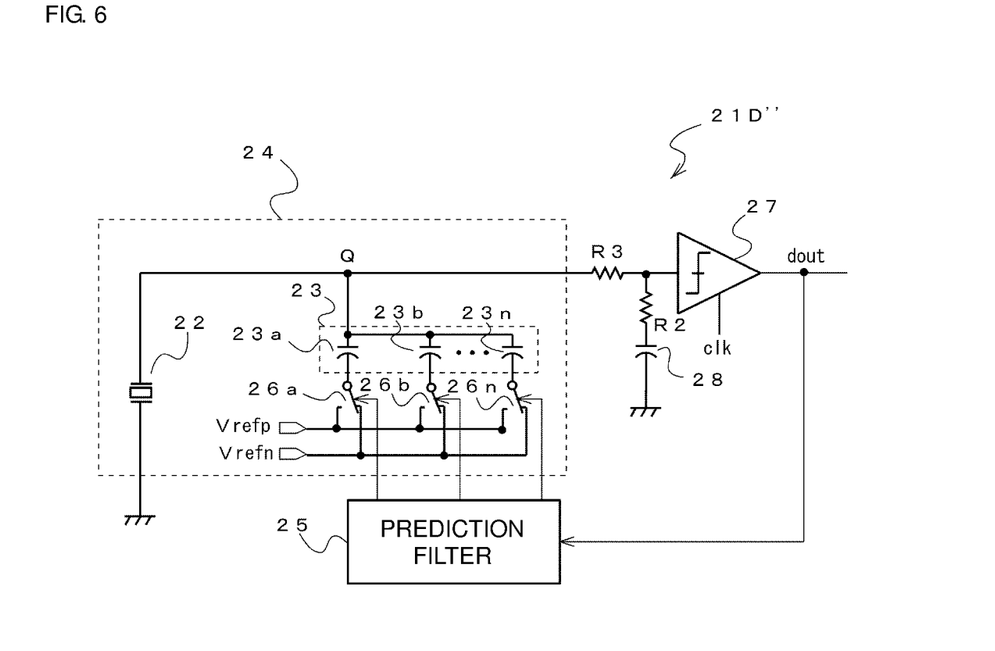
FIG. 6 is a circuit diagram illustrating a schematic configuration of a sensor device according to a second modified example of the fourth preferred embodiment of the present invention.

FIG. 6 is a circuit diagram illustrating a schematic configuration of a sensor device 21D" according to a second modified example of the fourth preferred embodiment. In FIG. 6, components identical to or corresponding to those in FIG. 5B are designated with the same reference characters, and will not be described.

The sensor device 21D" according to the second modified example of the fourth preferred embodiment is different from the sensor device 21D' according to the modified example only in that the resistor R1 connected between the capacitive charge output device 22 and the connecting point Q and the resistor Ra connected between the connecting point Q and the capacitor 23, in the sensor device 21D' according to the modified example in FIG. 5B are integrated into a single resistor R3 connected between the connecting point Q and the quantizer 27. The capacitor 23, the resistor R3, and the series circuit of the capacitor 28 and the resistor R2, which is connected between the input terminal of the quantizer 27 and the ground voltage, define a lag-lead filter. Also in the sensor device 21D" according to the second modified example of the fourth preferred embodiment, the lag-lead filter defines and functions as a loop filter. Therefore, the sensor device 21D" provides a similar operational effect to the sensor device 21D according to the fourth preferred embodiment. Further, the sensor device 21D" according to the second modified example of the fourth preferred embodiment achieves a reduction in the number of resistors as compared to the sensor device 21D' according to the modified example of the fourth preferred embodiment, resulting in a reduction in the area in which components are mounted.

Figure 7:
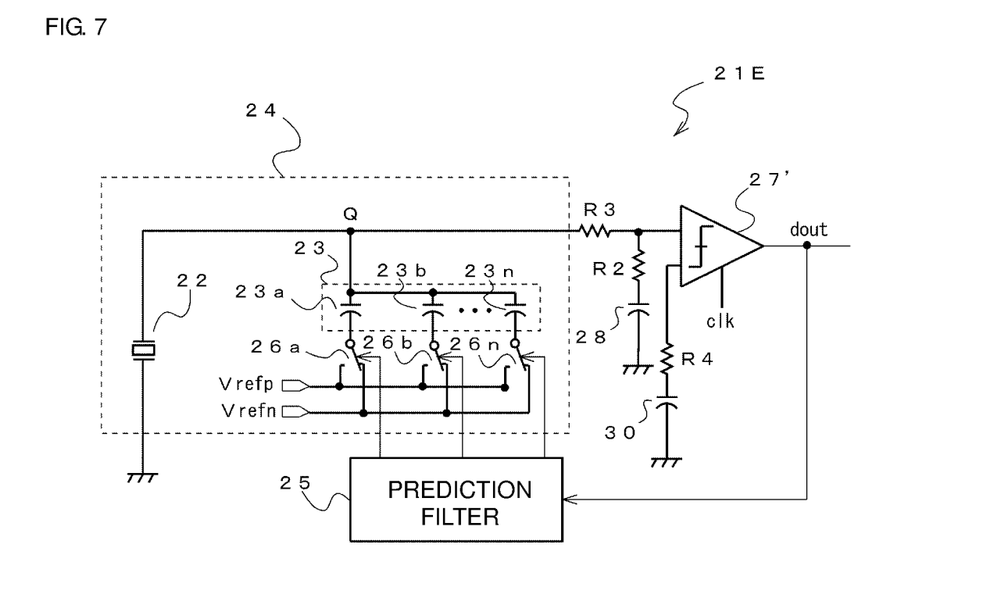
FIG. 7 is a circuit diagram illustrating a schematic configuration of a sensor device according to a fifth preferred embodiment of the present invention.

FIG. 7 is a circuit diagram illustrating a schematic configuration of a sensor device 21E according to a fifth preferred embodiment of the present invention. In FIG. 7, components identical to or corresponding to those in FIG. 6 are designated with the same reference characters, and will not be described.

The sensor device 21E according to the fifth preferred embodiment is different from the sensor device 21D" according to the second modified example of the fourth preferred embodiment in FIG. 6 only in the following points: a quantizer 27' includes a comparator; the series circuit of the resistor R2 and the capacitor 28 is connected between one of a pair of input terminals of the comparator and the ground voltage that is a reference voltage; and a series circuit of a resistor R4 and a capacitor 30 is connected between the other one of the pair of input terminals and the ground voltage. The series circuit of the resistor R2 and the capacitor 28 and the series circuit of the resistor R4 and the capacitor 30 preferably have the same or substantially the same impedance.

The sensor device 21E according to the fifth preferred embodiment also provides a similar operational effect to the sensor device 21D' according to the second modified example of the fourth preferred embodiment. Further, in the sensor device 21E according to the fifth preferred embodiment, the series circuit of the resistor R2 and the capacitor 28 and the series circuit of the resistor R4 and the capacitor 30, which preferably have the same or substantially the same impedance, are connected in a balanced manner between the ground voltage and the respective two input terminals of the comparator included in the quantizer 27'. Therefore, when both of the two input terminals of the quantizer 27' receive the same or substantially the same noise, the noise is able to be removed through a differential operation performed on the pair of input signals by the comparator included in the quantizer 27'.

Figure 8:
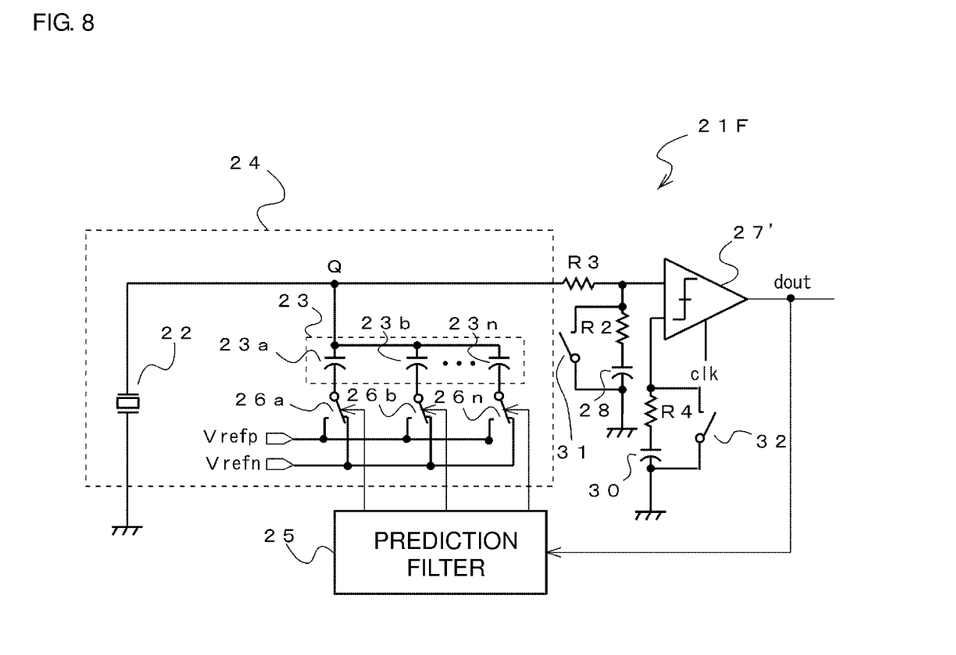
FIG. 8 is a circuit diagram illustrating a schematic configuration of a sensor device according to a sixth preferred embodiment of the present invention.

FIG. 8 is a circuit diagram illustrating a schematic configuration of a sensor device 21F according to a sixth preferred embodiment of the present invention. In FIG. 8, components identical to or corresponding to those in FIG. 7 are designated with the same reference characters, and will not be described.

The sensor device 21F according to the sixth preferred embodiment is different from the sensor device 21E according to the fifth preferred embodiment in FIG. 7 only in that switches 31 and 32 through which the respective two input terminals of the comparator included in the quantizer 27' are connected to the ground voltage are provided in parallel to the series circuit of the resistor R2 and the capacitor 28 and the series circuit of the resistor R4 and the capacitor 30, respectively.

The sensor device 21F according to the sixth preferred embodiment also provides a similar operational effect to the sensor device 21E according to the fifth preferred embodiment. Further, in the sensor device 21F according to the sixth preferred embodiment, for example, when a charge exceeding the range in which a circuit included in the A/D converter operates normally flows into the capacitive adder 24, or when use of the sensor device 21F begins, the switches 31 and 32 are conducted so that the respective two input terminals of the quantizer 27' are connected to the ground voltage. Thus, a charge building up in the capacitive adder 24 is able to be discharged through the switches 31 and 32, thus enabling the circuit to be reset.

In the present preferred embodiment, the switches 31 and 32 are provided in parallel to the series circuit of the resistor R2 and the capacitor 28 and the series circuit of the resistor R4 and the capacitor 30, respectively. Alternatively, the switches 31 and 32 may be provided in parallel to the capacitor 28 and the capacitor 30, respectively. This configuration provides a similar operational effect to the present preferred embodiment.

Figure 9:
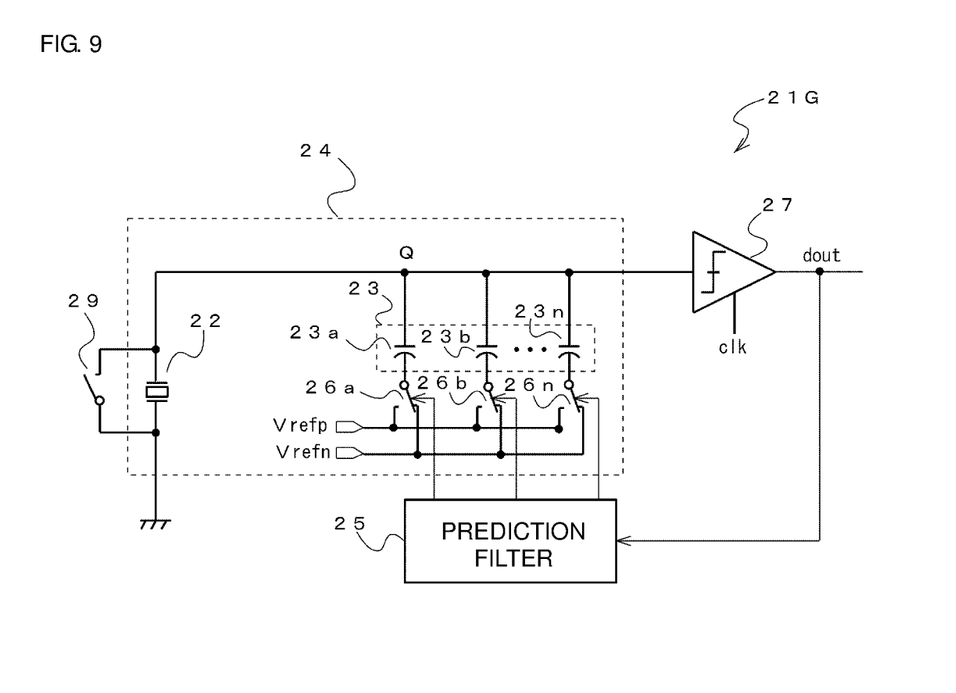
FIG. 9 is a circuit diagram illustrating a schematic configuration of a sensor device according to a seventh preferred embodiment of the present invention.

FIG. 9 is a circuit diagram illustrating a schematic configuration of a sensor device 21G according to a seventh preferred embodiment of the present invention. In FIG. 9, components identical to or corresponding to those in FIG. 2 are designated with the same reference characters, and will not be described.

The sensor device 21G according to the seventh preferred embodiment is different from the sensor device 21A according to the first preferred embodiment only in that a switch 29 that provides a short circuit between both the terminals of the capacitive charge output device 22 is provided.

In the sensor device 21G according to the seventh preferred embodiment, when a large amount of charge builds up in the capacitive charge output device 22, a short circuit between both the terminals of the capacitive charge output device 22 is made using the switch 29. Thus, the capacitive charge output device 22 may be reset at any time. Therefore, the stability of the output of the sensor device 21E is improved. In addition, also in the sensor devices 21B, 21C, 21C', 21D, 21D', 21D'', 21E, and 21F according to the second, third, fourth, fifth, and sixth preferred embodiments and their modified examples described above, the switch 29 may preferably be provided between both of the terminals of the capacitive charge output device 22 in the same or similar manner. Thus, a similar operational effect to the sensor device 21G according to the seventh preferred embodiment is provided.

Figure 10A:
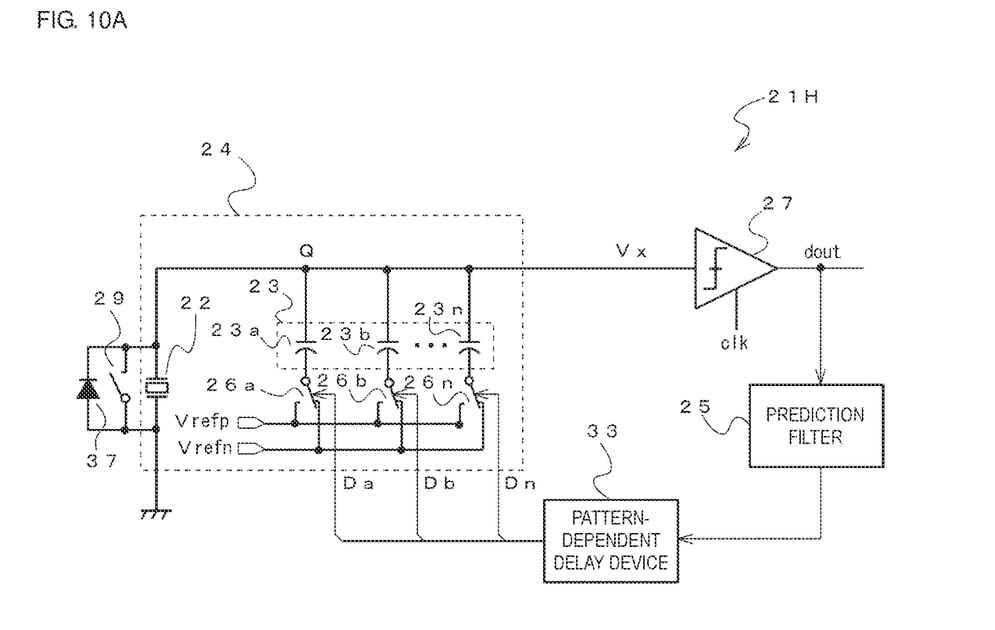
FIG. 10A is a circuit diagram illustrating a schematic configuration of a sensor device according to an eighth preferred embodiment of the present invention.

FIG. 10A is a circuit diagram illustrating a schematic configuration of a sensor device 21H according to an eighth preferred embodiment of the present invention. In FIG. 10A, components identical to or corresponding to those in FIG. 9 are designated with the same reference characters, and will not be described.

Figure 11A:
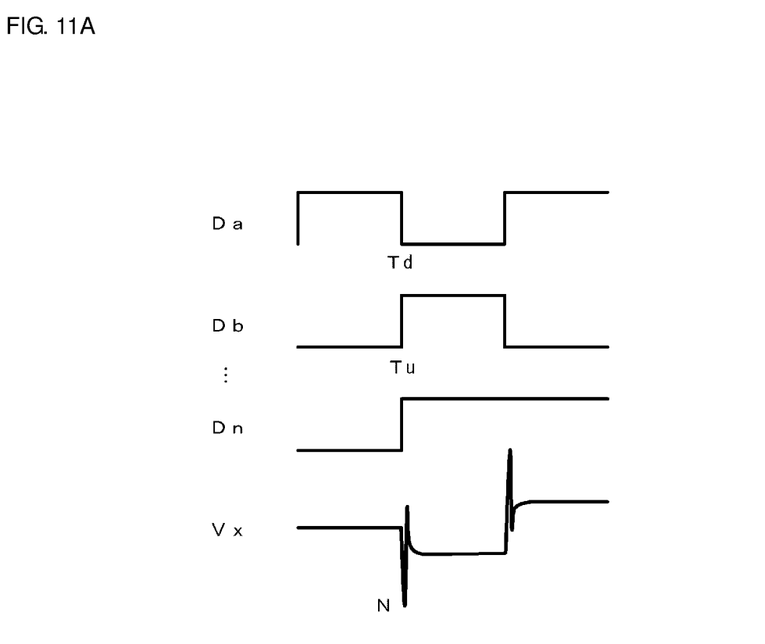
FIG. 11A is a timing chart of pulse signals, which are provided to switches, and a voltage, which is input to a quantizer, in each of the sensor devices according to the first to seventh preferred embodiments of the present invention.
Figure 11B:
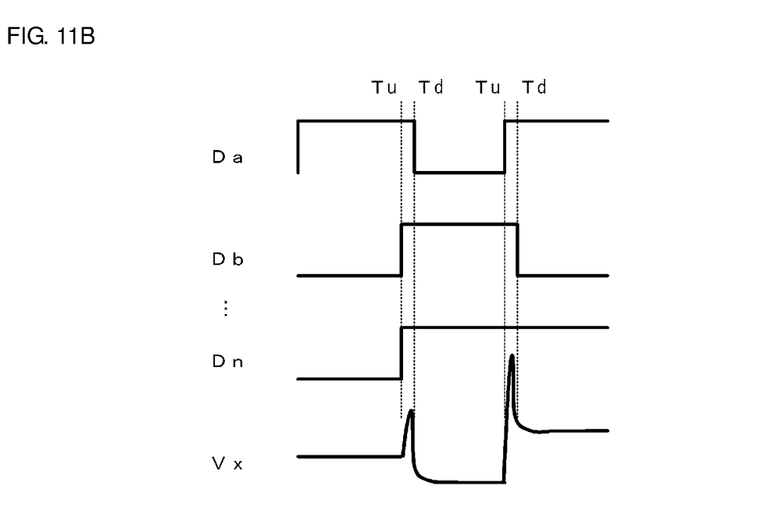
FIG. 11B is a timing chart of pulse signals, which are provided to switches, and a voltage, which is input to a quantizer, in the sensor device according to the eighth preferred embodiment of the present invention.

The sensor device 21H according to the eighth preferred embodiment is different from the sensor device 21G according to the seventh preferred embodiment in FIG. 9 only in that a pattern-dependent delay device 33 is provided between the prediction filter 25 and the switches 26a, 26b, . . . , 26n. In the sensor devices 21A to 21G according to the first to seventh preferred embodiments, the prediction filter 25 performs conversion into an analog voltage value in accordance with the predicted value. In the conversion, pulse signals Da, Db, . . . , Dn as illustrated in FIG. 11A are provided as control signals to the switches 26a, 26b, . . . , 26n connected to the capacitors 23a, 23b, . . . , 23n, and switching of the switches 26a, 26b, . . . , 26n is thus controlled. In the case of the high level in the pulse signals Da, Db, . . . , Dn, the voltage at the connecting point Q between the capacitive charge output device 22 and the capacitor 23 increases. In the case of the low level, the voltage at the connecting point Q decreases. The pattern-dependent delay device 33 converts the pulse signals Da, Db, . . . , Dn so that, as illustrated in FIG. 11B, a falling timing Td includes a delay from a rising timing Tu, and provides the resulting signals to the switches 26a, 26b, . . . , 26n. The prediction filter 25 selects the voltages applied to the capacitors 23a, 23b, . . . , 23n in the sensor device 21H according to the eighth preferred embodiment such that the pulse signals Da, Db, . . . , Dn obtained through such conversion are provided to the switches 26a, 26b, . . . , 26n, respectively.

As illustrated in FIG. 10A, a parasitic diode 37 is preferably attached between both of the terminals of the switch 29. The anode of the parasitic diode 37 is connected to the ground, and the cathode is connected to the connecting point Q. The parasitic diode 37 is parasitic in the forward direction towards the connecting point Q. For example, in the case in which the sensor device 21H is defined by, as an IC (integrated circuit), the circuit portion excluding the capacitive charge output device 22, and where the terminal of the IC which is connected to the connecting point Q is connected to an ESD (Electro Static Discharge) protection device which is not illustrated, a similar parasitic diode 37 may also be attached to the connecting point Q.

In this case, assume that switching of the switches 26a, 26b, . . . , 26n connected to the capacitors 23a, 23b, . . . , 23n is controlled by providing the switches 26a, 26b, . . . , 26n with the pulse signals Da, Db, . . . , Dn in which the rising timing and the falling timing occur at the same time, as illustrated in FIG. 11A. Depending on the generation timings of the pulse signals Da, Db, . . . , Dn, for example, the falling timing Td of the pulse signal Da may be slightly earlier than the rising timing Tu of the pulse signal Db. A negative glitch N as illustrated in FIG. 11A may occur in the voltage Vx at the connecting point Q. When the negative glitch N occurs and the voltage Vx becomes less than 0 [V] by a large amount, a forward direction voltage is applied to the parasitic diode 37, and the parasitic diode 37 conducts. Thus, the charge accumulated in the capacitive adder 24 is discharged, and an error occurs in the addition operation performed by the capacitive adder 24.

However, in the configuration of the sensor device 21H according to the eighth preferred embodiment, switching of the switches 26a, 26b, . . . , 26n connected to the capacitors 23a, 23b, . . . , 23n is controlled by providing the switches 26a, 26b, . . . , 26n with the pulse signals Da, Db, . . . , Dn, as control signals, in which the falling timing Td includes a delay from the rising timing Tu, as illustrated in FIG. 11B. Therefore, the falling timing Td of the pulse signal Da occurs after the rising timing Tu of the pulse signal Db, and a glitch at the input of the quantizer 27 is always produced on the positive side, not on the negative side, such as the voltage Vx at the connecting point Q illustrated in FIG. 11B. Therefore, a forward direction voltage is not applied to the parasitic diode 37. Thus, the case in which the parasitic diode 37 conducts and in which the charge accumulated in the capacitive adder 24 is discharged will not occur. As a result, no errors will occur in the addition operation performed by the capacitive adder 24.

Figure 10B:
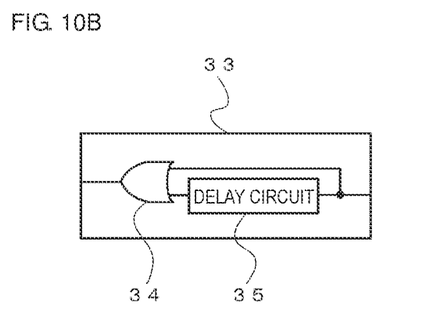
FIG. 10B is a circuit diagram illustrating the configuration of a pattern-dependent delay device included in the sensor device illustrated in FIG. 10A.
Figure 10C:
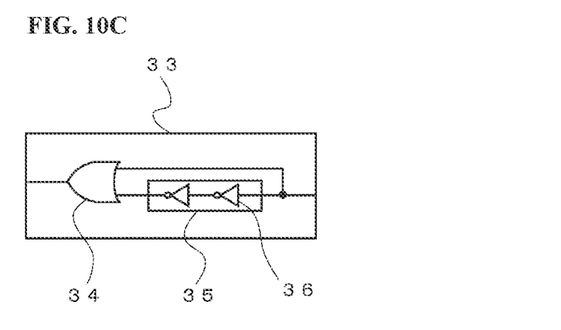
FIG. 10C is a circuit diagram illustrating the configuration of a delay circuit included in the pattern-dependent delay device illustrated in FIG. 10B.

For example, as illustrated in FIG. 10B, the pattern-dependent delay device 33 includes a delay circuit 35 that delays a signal that is to be received by one of the inputs of an OR circuit 34. For example, as illustrated in FIG. 10C, the delay circuit 35 includes an even number of inverters 36 that are connected to each other in series. The pattern-dependent delay device 33 is thus defined. Accordingly, when each of the pulse signals Da, Db, . . . , Dn drops from the high level to the low level, the delay circuit 35 delays the high-level time of the signal received by the input of the OR circuit 34. Thus, the time until the output of the OR circuit 34 drops to the low level is delayed. Therefore, this delay enables generation of the pulse signals Da, Db, . . . , Dn in which the falling timing Td includes a delay from the rising timing Tu, as illustrated in FIG. 11B. In contrast, when each of the pulse signals Da, Db, . . . , Dn rises from the low level to the high level, the delay circuit 35 delays the low-level time of the signal received by the input of the OR circuit 34. However, the signal received by the other input of the OR circuit 34 is not delayed. Therefore, the rising timing of the signal at the output of the OR circuit 34 is not delayed, and the signal changes from the low level to the high level without a delay.

Also in the sensor devices 21A, 21B, 21C, 21C', 21D, 21D', 21D", 21E, and 21F according to the first, second, third, fourth, fifth, and sixth preferred embodiments and their modified examples described above, the pattern-dependent delay device 33 may preferably be provided between the prediction filter 25 and the switches 26a, 26b, . . . , 26n in a similar manner. Thus, a similar operational effect to the sensor device 21H according to the eighth preferred embodiment is provided.

The sensor devices 21A to 21H according to the preferred embodiments of the present invention and their modified examples described above are preferably used as a person detecting sensor when a pyroelectric infrared sensor is used as the capacitive charge output device 22, and are preferably used as a pressure/vibration/impact measurement sensor used in various applications in the industrial field when a pressure/vibration/impact sensor is used as the capacitive charge output device 22.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sensor device comprising:
an A/D converter including:
a capacitive adder that computes a difference between an analog input signal and a predicted value;
a quantizer that quantizes the difference which is output from the capacitive adder, and that converts, for output, the analog input signal into a digital signal; and
a digital prediction filter that generates the predicted value from the digital signal which is output from the quantizer, and that outputs the predicted value to the capacitive adder; wherein
the capacitive adder includes a first series circuit and a first capacitor, the first series circuit including a capacitive charge output device that provides the analog input signal to a connecting point, the first capacitor is charged based on the predicted value output from the digital prediction filter to provide an analog voltage value to the connecting point, and the analog voltage value corresponds to the digital predicted value; and
the connecting point is between the capacitive charge output device and the first capacitor and is connected to an input of the quantizer.

2. The sensor device according to claim 1, wherein
the first capacitor includes a plurality of capacitors connected to each other in parallel; and
the digital prediction filter selects voltages applied to the plurality of capacitors, and uses the plurality of capacitors to perform D/A conversion on a voltage value applied to the connecting point, into the analog voltage value corresponding to the predicted value.

3. The sensor device according to claim 2, wherein the voltages applied to the plurality of capacitors are selected such that switching of switches connected to the plurality of capacitors is controlled by providing control signals to the switches, the control signals being signals in which a timing at which a voltage at the connecting point is decreased is provided with a delay from a timing at which the voltage at the connecting point is increased.

4. The sensor device according to claim 1, wherein the capacitive charge output device is connected to the connecting point through a resistor.

5. The sensor device according to claim 1, wherein the capacitive adder includes a loop filter defined by a passive element.

6. The sensor device according to claim 5, wherein the loop filter is a lag-lead filter.

7. The sensor device according to claim 6, wherein the lag-lead filter includes:
a first resistor that is connected between the capacitive charge output device and the connecting point;
a second resistor that is connected between the connecting point and the first capacitor;
the first capacitor that is connected between the second resistor and the digital prediction filter; and
a second series circuit that includes a third resistor and a second capacitor and is connected between an input terminal of the quantizer and a reference voltage.

8. The sensor device according to claim 7, wherein
the quantizer includes a comparator; and
the sensor device includes:
the second series circuit that is connected between a first input terminal of two input terminals of the comparator and the reference voltage; and
a third series circuit that includes a fourth resistor and third capacitor, the third series circuit being connected between a second input terminal of the two input terminals and a reference voltage, the third series circuit having a same impedance as that of the second series circuit.

9. The sensor device according to claim 8, further comprising switches that connect the two input terminals to the reference voltages.

10. The sensor device according to claim 6, wherein the lag-lead filter includes:
a first resistor that is connected between the connecting point and the quantizer;
the first capacitor that is connected between the connecting point and the digital prediction filter; and
a second series circuit that includes the first resistor and the first capacitor and is connected between an input terminal of the quantizer and a reference voltage.

11. The sensor device according to claim 10, wherein
the quantizer includes a comparator; and
the sensor device includes:
   the second series circuit that is connected between a first input terminal of two input terminals of the comparator and the reference voltage; and
   a third series circuit including a second resistor and a second capacitor, the third series circuit being connected between a second input terminal of the two input terminals and a reference voltage, the third series circuit having an impedance having a same impedance as that of the second series circuit.

12. The sensor device according to claim 11, further comprising switches that connect the two input terminals to the reference voltages.

13. The sensor device according to claim 1, further comprising a switch that provides a short circuit between both terminals of the capacitive charge output device.

14. The sensor device according to claim 1, wherein the capacitive charge output device includes a pyroelectric infrared sensor which produces a charge due to a pyroelectric effect caused by a change in temperature of the sensor device.

15. The sensor device according to claim 1, wherein the capacitive charge output device includes a piezoelectric-ceramics pressure/vibration/impact sensor which produces a charge proportional to a stress when the stress is applied to the sensor device.

16. The sensor device according to claim 1, further comprising:
   a second series circuit including a resistor and a second capacitor; wherein
   the second series circuit is connected between the connecting point and a reference voltage.

* * * * *